United States Patent
McClanahan et al.

(10) Patent No.: US 6,846,095 B2
(45) Date of Patent: Jan. 25, 2005

(54) LIGHTED CASSETTE ALIGNMENT FIXTURE

(75) Inventors: Adolphus E. McClanahan, Garland, TX (US); L. C. Coleman, Jr., Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 174 days.

(21) Appl. No.: 10/199,262

(22) Filed: Jul. 19, 2002

(65) Prior Publication Data

US 2003/0168418 A1 Sep. 11, 2003

Related U.S. Application Data

(60) Provisional application No. 60/344,201, filed on Dec. 28, 2001.

(51) Int. Cl.[7] .................................................. F21V 33/00
(52) U.S. Cl. ...................................... 362/253; 362/154
(58) Field of Search ................................. 362/154, 253, 362/555, 800, 92

(56) References Cited

U.S. PATENT DOCUMENTS

| | | | | |
|---|---|---|---|---|
| 5,933,521 A | * | 8/1999 | Pasic ........................... | 382/145 |
| 6,188,185 B1 | * | 2/2001 | Ter-Hovhannisian et al. .... | 315/312 |
| 6,578,979 B2 | * | 6/2003 | Truttmann-Battig ......... | 362/92 |

* cited by examiner

Primary Examiner—John Anthony Ward
(74) Attorney, Agent, or Firm—Frederick J. Telecky, Jr.; W. James Brady, III

(57) ABSTRACT

Disclosed is a lighted wafer cassette for use in semiconductor wafer processing. Also disclosed are systems and methods employing a wafer cassette lighted with one or more affixed light sources for facilitating cassette alignment with standard semiconductor processing apparatus.

15 Claims, 3 Drawing Sheets

LIGHTED CASSETTE ALIGNMENT FIXTURE

PRIORITY DATE

This application claims the benefit of U.S. Provisional Application No. 60/344,201, filed Dec. 28, 2001.

TECHNICAL FIELD

The invention relates to devices, systems, and methods for providing an illuminated wafer cassette and facilitating alignment of a semiconductor process transfer blade apparatus with the wafer cassette. More particularly, the invention relates to providing precise wafer cassette illumination useful in performing alignment procedures.

BACKGROUND OF THE INVENTION

It is standard in the semiconductor industry to use a wafer cassette to hold a lot of (usually 25) wafers. Many of the tools for the various semiconductor processor activities, such as implantation, photo resist, and testing, use the same apparatus having a transfer blade designed to insert and retrieve wafers from a standard cassette. The transfer blade of such apparatus requires mechanical alignment with the wafer shelves of the cassette. It is known in the arts to align the top wafer shelf in the cassette, the bottom wafer shelf in the cassette, e.g., the $25^{th}$ wafer, and a wafer selected from somewhere near the middle. These three alignment points are generally sufficient to ensure that the remainder of the wafer shelves are suitably aligned with the transfer blade. Adjustments are made through an operator interface generally requiring the use of the operator's hands. Typically, the operator peers into the wafer cassette and performs the alignment by observing the position of the transfer blade mechanism relative to the wafer shelves of a cassette, making mechanical adjustments as required.

Problems arise in the art due to conditions hampering the visual observation. For example, it is generally dark within the wafer cassette. It is known for the operator to attempt to shine a flashlight into the cassette. This solution is successful to some degree, but does not provide ideal illumination due to obstructions. Additionally, this requires one of the operator's hands, which would otherwise be available for making mechanical adjustments. Additionally, because the wafers have a highly reflective surface, glare and reflected light make observation of crucial areas difficult. These and other complications in making visual observations in order to perform transfer blade alignment lead to additional problems such as increased time required to perform the alignment process, decreased yield due to improper alignment, and possibly damaged wafers.

It would be desirable in the arts to develop devices, systems and methods providing improved illumination for transfer blade alignment relative to a wafer cassette. Such improvements would provide many advantages, including reduced cycle time, increased yield, convenience, and more accurate alignment.

SUMMARY OF THE INVENTION

In general, the invention provides devices, systems, and methods for illuminating critical areas of wafer cassettes and semiconductor processing apparatus transfer blades for purposes of alignment.

According to one aspect of the invention, a lighted wafer cassette for use in semiconductor wafer processing is provided. A cassette framework has a number of wafer shelves with at least one light source affixed to one or more of the wafer shelves. The light sources are positioned for illuminating one or more of the wafer shelves within the cassette.

According to another aspect of the invention, a system for aligning wafer-processing apparatus relative to a wafer cassette is provided. Wafer-processing apparatus designed to receive a wafer cassette and having a moveable transfer blade is equipped with a wafer cassette. The wafer cassette has multiple wafer shelves designed to hold semiconductor wafers. One or more light sources are affixed to the wafer cassette and positioned for illuminating one or more of the wafer shelves. The system also includes a power source used to provide power to the light sources. Means are provided for aligning the transfer blade with the wafer shelves.

An additional aspect of the invention provides a method of aligning a moveable blade of a wafer-processing apparatus and the wafer shelves of a wafer cassette. The method includes steps of coupling the wafer cassette to the wafer-processing apparatus and illuminating one or more wafer shelves using one or more light sources affixed to the wafer cassette. A step of mechanically aligning the moveable blade relative to the one or more illuminated wafer shelves is also provided.

According to still another aspect of the invention, a method of illuminating the transfer blade of a wafer-processing apparatus and a wafer shelf of a wafer cassette for alignment purposes is disclosed. One or more light sources are attached to a selected wafer shelf of the wafer cassette. The wafer cassette is coupled to the wafer-processing apparatus such that moving the transfer blade into alignment with the selected wafer shelf is facilitated by illuminating the transfer blade and the selected wafer shelf using the one or more light sources.

Technical advantages are provided by the invention, including but not limited to precise placement of illumination in locations crucial to properly aligning wafer cassette shelves with semiconductor processing apparatus. Further advantages realized include reduced alignment time, more accurate alignment, improved yields, reduced costs, and convenience to the operator.

BRIEF DESCRIPTION OF THE DRAWINGS

For a better understanding of the invention including its features, advantages and specific embodiments, reference is made to the following detailed description along with accompanying drawings in which.

References in the detailed description correspond to like references in the figures unless otherwise noted. Like numerals refer to like parts throughout the various figures. The descriptive and directional terms used in the written description such as top, bottom, left, right, etc., refer to the drawings themselves as laid out on the paper and not to physical limitations of the invention unless specifically noted. The drawings are not necessarily to scale and some features of embodiments shown and discussed are simplified or exaggerated for illustrating the principles of the invention.

DETAILED DESCRIPTION OF PREFERRED EMBODIMENTS

While the making and using of various embodiments of the present invention are discussed in detail below, it should be appreciated that the present invention provides many applicable inventive concepts which can be embodied in a wide variety of specific contexts. It should be understood that the invention may be practiced with wafer cassettes and transfer mechanisms of various types and materials without altering the principles of the invention.

Figure 1:
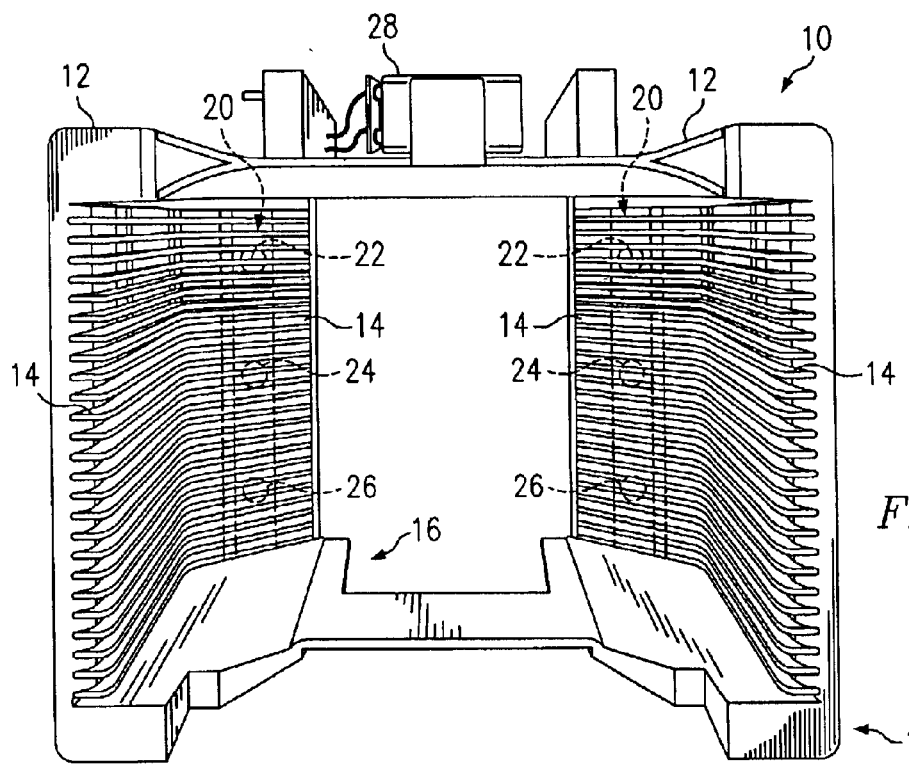
FIG. 1 is a rear view of an example of a preferred embodiment of a lighted cassette of the invention.
Figure 2:
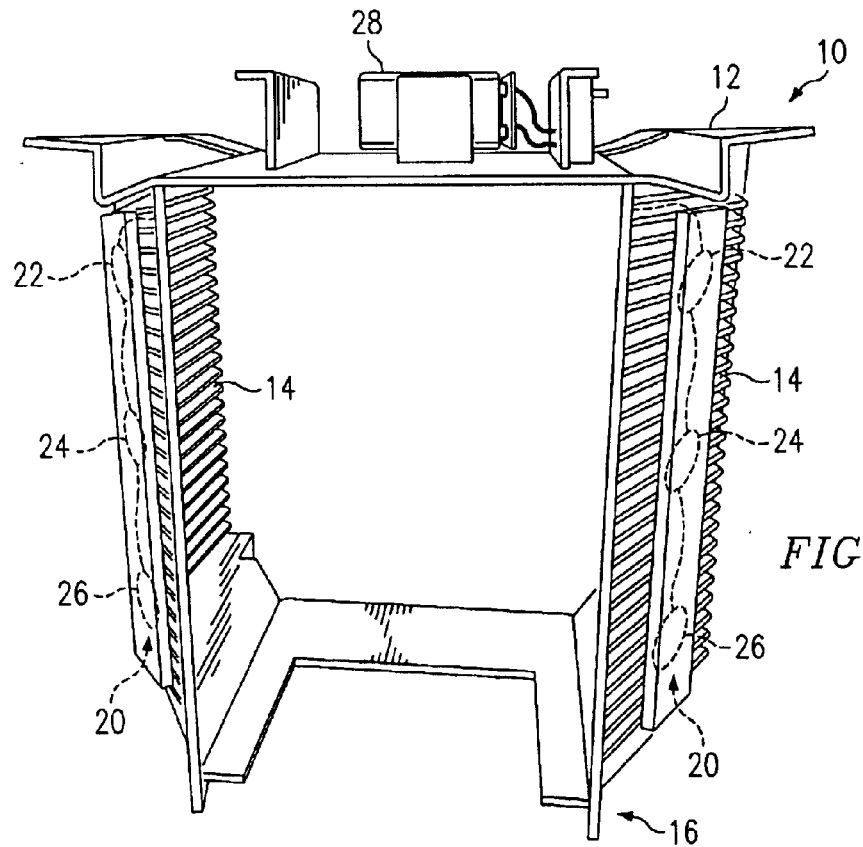
FIG. 2 is a front view of an example of a preferred embodiment of a lighted cassette of the invention.

FIG. 1 shows a rear view of a wafer cassette 10 in a preferred embodiment of the invention. A framework 12 made of a rigid material such as, for example, plastic or other similar substance, provides a structure for supporting a number of wafer shelves 14, which, according to one embodiment, consists of 25 wafer shelves, for retaining a lot of 25 semiconductor wafers. Referring to FIGS. 1 and 2, the wafer shelves 14 are parallel to one another and are generally narrower at the front end 16 and wider at the rear 18. In the presently most preferred embodiment of the invention, light sources 20, in this case LEDs, are installed at the front end of the top, bottom and middle wafer shelves 22, 24 and 26, respectively.

As can be seen with further reference to FIG. 1, it is preferred to mount light sources 20 at each side of the selected wafer shelves (22, 24, 26). Although it is generally preferred to select the top, middle and bottom wafer shelves for alignment purposes, thereby reasonably assuring that all shelves in the cassette are aligned, those skilled in the arts will appreciate that alternatives are possible. For example, the second, next to last, and other arbitrarily selected wafer shelves may be selected for alignment, or all wafer shelves may be aligned. Preferably, a power source 28 is provided and electrically coupled to the light sources 20. In this case, a standard battery is shown as the power source 28. Of course, alternative power sources may be used, such as a vacuum sealed battery, photovoltaic cells, or simply a coupling to an external power source.

A front view of the lighted wafer cassette 10 of FIG. 1 is shown in FIG. 2. The narrow front 16 is shown obstructing the light sources 20. It will be clear to those familiar with the arts that the light sources 20 of the invention provide illumination located in areas difficult or impossible to illuminate using the prior art. Also shown in FIG. 2 are top and bottom coupling points 30 and 32, respectively, for operably coupling the wafer cassette 10 to semiconductor processing apparatus.

Figure 3:
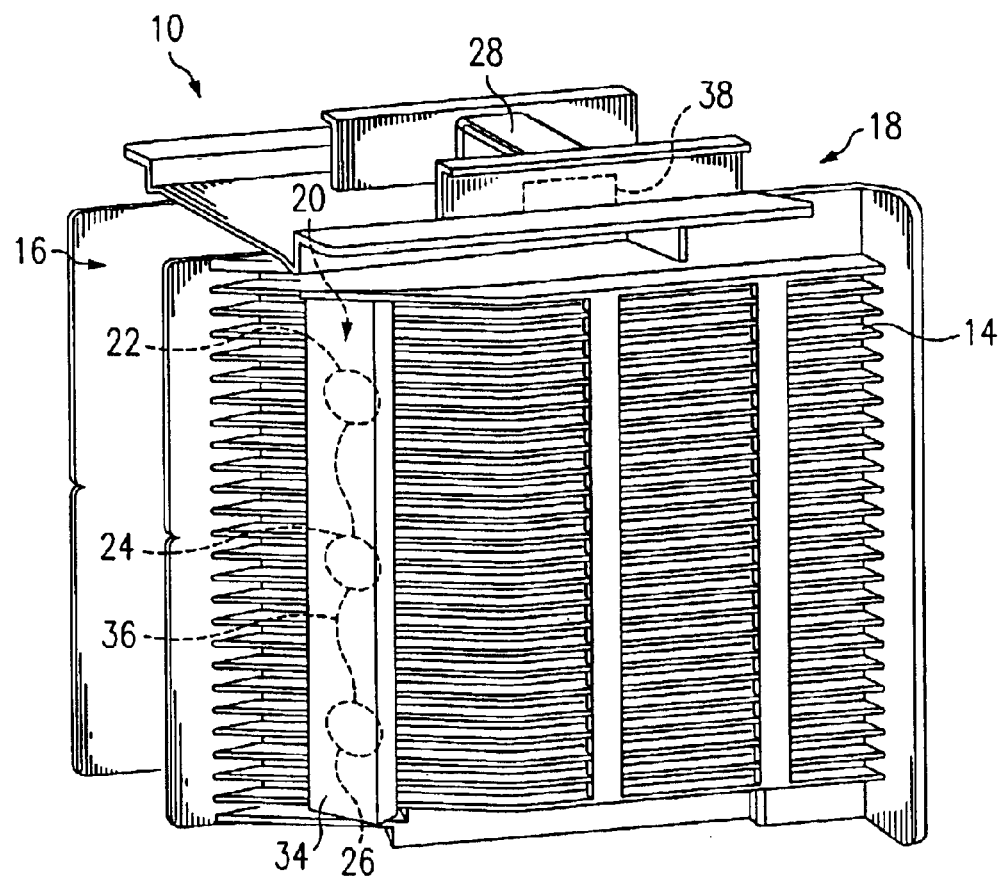
FIG. 3 is a side view of an example of a preferred embodiment of a lighted cassette of the invention.

Depicted in FIG. 3 is a side view of the wafer cassette 10 of the invention. A light source cover 34 is shown encasing the light sources 20 (shown as dotted lines) and associated wiring 36. Control circuitry 38 is preferably included to complete the operable coupling of the power source 28 and light sources 20. Typically the control circuitry 38 will include a voltage regulator 42 (shown in FIG. 4) and a manually or remotely activated switch 40 for controlling the light sources 20.

Figure 4:
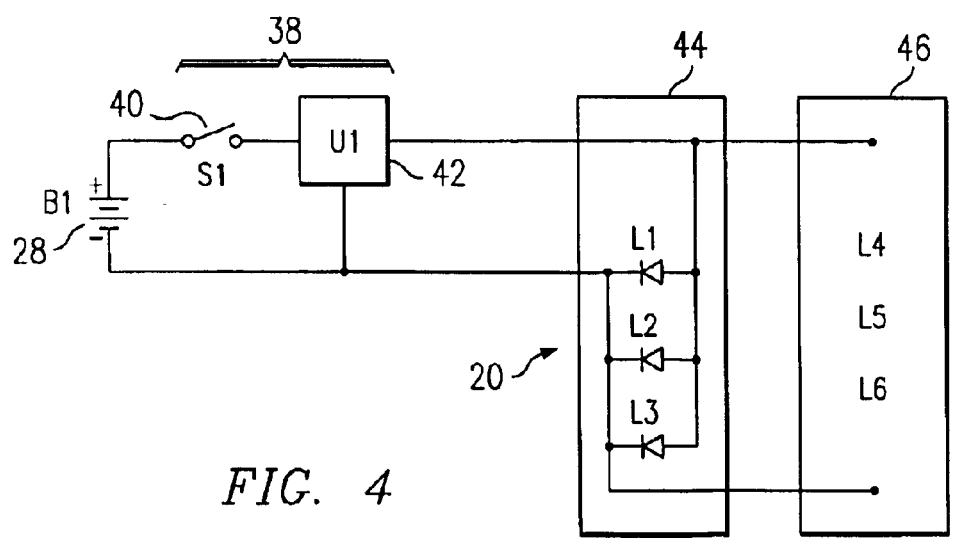
FIG. 4 is a schematic diagram of an example of the circuitry of the embodiment of the invention shown in FIG. 1.

FIG. 4 is a schematic diagram illustrating the electrical parts and operation of the lighted wafer cassette 10 according to the invention. In the presently preferred embodiment, the control circuitry 38 has a mechanical switch 40 electrically connected to the power source 28, in this case a 9-Volt battery which, in turn, is also coupled with a voltage regulator 42 and parallel banks of light sources 20. In this example clear white light LEDs labeled L1–L6, are used and coupled to voltage regulator 42. Thus, in operation, two banks of LEDs, including a first bank 44, which includes L1, L2 and L3, and a second bank 46 made up of L4, L5 and L6, are connected in parallel to the output of the voltage regulator 42 which is used to adjust the output from the power source 28 for compatibility with to the LEDs. It is contemplated that the various alternative circuit arrangements are possible, particularly with respect to light sources, intensity, or color. For example, small fluorescent or incandescent lighting may be used and different portions of the visible or non-visible light spectrum may be used without departing from the concept of the invention. Also, alternative switching devices, such as a remotely activated switch, may be used.

Figure 5:
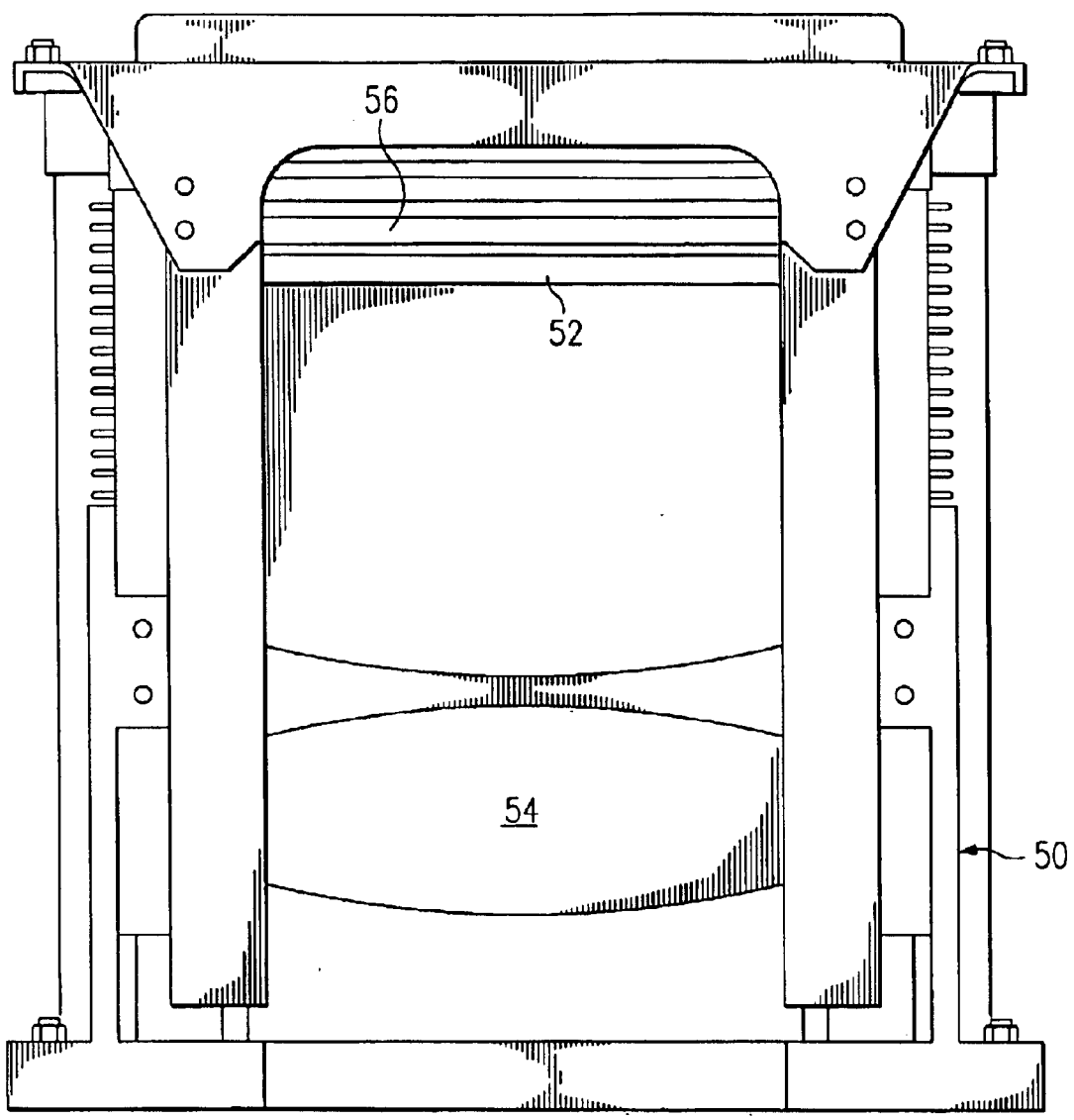
FIG. 5 is a perspective view of an example of a preferred embodiment of a lighted cassette in use in a semiconductor processing apparatus according to the invention.

FIG. 5 shows an example of a lighted cassette 10 configured according to FIGS. 1–4, in use in a load-lock device 50. A transfer blade 52 is also shown. A bottom wafer 54 is visible at a bottom wafer shelf, and a top wafer 56 is shown at a top wafer shelf. In use, an operator may visually observe the transfer blade 52 as it moves within the lighted cassette 10 and may make adjustments as necessary to achieve proper alignment.

The embodiments shown and described above are only exemplary. Even though numerous characteristics of the present invention have been set forth in the foregoing description together with details of the method and device of the invention, the disclosure is illustrative only and changes may be made within the principles of the invention to the full extent indicated by the broad general meaning of the terms used in the attached claims.

We claim:

1. A system for aligning wafer-processing apparatus relative to a wafer cassette, comprising:
    a wafer-processing apparatus for receiving a wafer cassette, the wafer-processing apparatus having a moveable transfer blade;
    a wafer cassette adapted for coupling with the wafer-processing apparatus and having a plurality of wafer-receiving shelves;
    one or more light sources affixed to the wafer cassette and positioned for illuminating one or more of the wafer-receiving shelves;
    a power source operably coupled to the one or more light sources; and
    adjustment means for aligning the transfer blade and the one or more illuminated wafer-receiving shelves.

2. A system for aligning a wafer-processing apparatus relative to a wafer cassette according to claim 1 wherein the wafer cassette further comprises one or more light sources positioned for illuminating a top wafer shelf.

3. A system for aligning a wafer-processing apparatus relative to a wafer cassette according to claim 1 wherein the wafer cassette further comprises one or more light sources positioned for illuminating a middle wafer shelf.

4. A system for aligning a wafer-processing apparatus relative to a wafer cassette according to claim 1 wherein the wafer cassette further comprises one or more light sources positioned for illuminating a bottom wafer shelf.

5. A system for aligning a wafer-processing apparatus relative to a wafer cassette according to claim 1 wherein the one or more light sources further comprise Light Emitting Diodes (LEDs).

6. A system for aligning a wafer-processing apparatus relative to a wafer cassette according to claim 1 wherein the one or more light sources further comprise Light Emitting Diodes (LEDs) adapted to emit white light.

7. A system for aligning a wafer cassette relative to wafer-processing apparatus according to claim 1 wherein the power source further comprises a battery.

8. A system for aligning a wafer cassette relative to wafer-processing apparatus according to claim 1 wherein the wafer-processing apparatus comprises load-lock apparatus.

9. A method of aligning a moveable blade of a wafer-processing apparatus and the wafer shelves of a wafer cassette, comprising the steps of:
    operably coupling the wafer cassette to the wafer-processing apparatus;
    illuminating one or more wafer shelves of the wafer cassette using one or more light sources affixed to the wafer cassette; and
    mechanically aligning the moveable blade relative to the one or more illuminated wafer shelves.

10. A method of aligning the moveable blade of a wafer-processing apparatus and the wafer shelves of a wafer cassette according to claim 9 wherein the illuminating and aligning steps further comprise the steps of illuminating and aligning at least a top wafer shelf and a bottom wafer shelf.

11. A method of aligning the moveable blade of a wafer-processing apparatus and the wafer shelves of a wafer cassette according to claim 9 wherein the illuminating and aligning steps further comprise the steps of illuminating and aligning at least a middle wafer shelf.

12. A method of illuminating the transfer blade of a wafer-processing apparatus and a selected wafer shelf of a wafer cassette, comprising the steps of:
    operably coupling one or more light sources to a selected wafer shelf of the wafer cassette;
    operably coupling the wafer cassette to the wafer-processing apparatus;
    moving the transfer blade into alignment with the selected wafer shelf; and,
    illuminating the transfer blade and the selected wafer shelf using the one or more light sources.

13. A method of illuminating the transfer blade of a wafer-processing apparatus and a wafer shelf of a wafer cassette according to claim 12 further comprising the step of selecting a top wafer shelf.

14. A method of illuminating the transfer blade of a wafer-processing apparatus and a wafer shelf of a wafer cassette according to claim 12 further comprising the step of selecting a middle wafer shelf.

15. A method of illuminating the transfer blade of a wafer-processing apparatus and a wafer shelf of a wafer cassette according to claim 12 further comprising the step of selecting a bottom wafer shelf.

* * * * *